Aug. 26, 1969 F. W. GUTZWILLER 3,463,970

INTEGRATED SEMICONDUCTOR RECTIFIER ASSEMBLY

Filed Oct. 26, 1966

INVENTOR:
FRANK W. GUTZWILLER,
BY Urban H. Faubion
HIS ATTORNEY.

United States Patent Office 3,463,970
Patented Aug. 26, 1969

3,463,970
INTEGRATED SEMICONDUCTOR RECTIFIER ASSEMBLY

Frank W. Gutzwiller, Auburn, N.Y., assignor to General Electric Company, a corporation of New York Filed Oct. 26, 1966, Ser. No. 589,585
Int. Cl. H01l 19/00
U.S. Cl. 317—234 5 Claims

ABSTRACT OF THE DISCLOSURE

An electrically insulative header supports two pellets mounted side-by-side. One of the pellets is N conductivity type with a plurality of laterally spaced P type regions while the other pellet is P conductivity type with a plurality of N type regions spaced to correspond with the P type regions. Output electrodes cooperate with the pellets. Input wire leads each extend between one of the P type regions and the corresponding N type region on the remaining pellet. The wire leads may extend through the header to one side of the pellets and be bent over for electrical contact. The pellets may be sealingly encapsulated.

This invention relates to rectifier circuits and more particularly to "integrated" rectifier circuit assemblies and has for an object the provision of integrated rectifier circuits which can be included in a single housing or assembly unit thereby reducing the cost below the normal power rectifier circuits wherein individual rectifiers each in an individual housing are used.

Typical of rectifier circuits wherein individual rectifier diodes are used are three phase bridge circuits such as are used by the automotive industry with automotive alternators and single phase bridge circuits such as are used in common power applications wherein a single phase alternating current source is rectified to obtain a full wave direct current output. The present invention allows the fabrication of such circuits in an integrated assembly which can be incorporated in an individual housing rather than utilizing a number of individual rectifier diodes with the resulting multiplicity of electrical connections and housings.

In carrying out the invention in a preferred form, at least a pair of semiconductor pellets each of opposite conductivity type are provided and each of the individual pellets is provided with regions of the opposite conductivity type in one surface so that each region forms a PN junction with the material in which it resides. The bulk material of each of the pellets is provided with a device contact and each region in one of the pellets is directly connected to the corresponding region on the other pellet (of opposite conductivity type) and each such connection is further provided as a device electrode thereby to form with the contacts connected to the bulk material of each pellet a rectifier circuit assembly The novel features which are believed to be characteristic of the invention are set forth with particularity in the appended claims. The invention itself, however, both as to its organization and method of operation, together with further objects and advantages thereof, may best be understood by reference to the following description taken in connection with the accompanying drawing in which:

Figure 2:
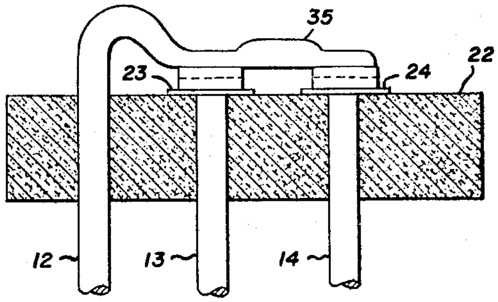
FIGURE 2 is a side elevation of a portion of an integrated three phase rectifier circuit assembly constructed in accordance with principles of the present invention.
Figure 4:
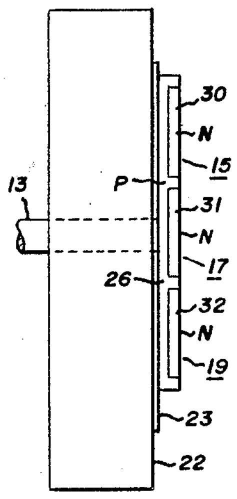
Figure 3:
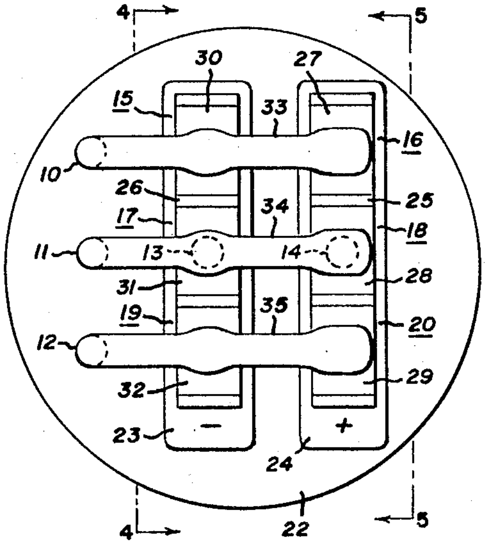
FIGURE 3 is a plan view of the device of FIGURE 2.
Figure 5:
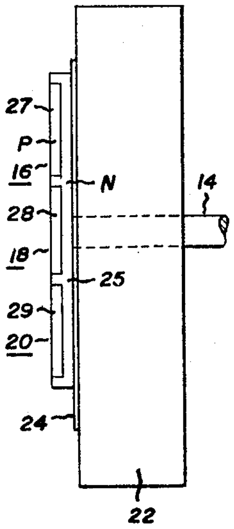
Figure 6:
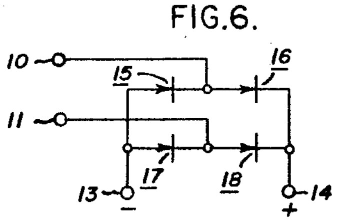
Figure 7:
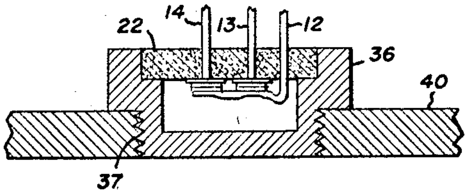
Figure 8:
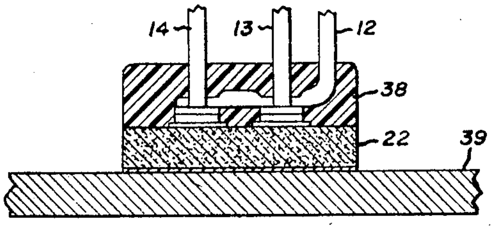

FIGURES 4 and 5 are elevations taken along view lines 4—4 and 5—5 respectively of FIGURE 3, each showing a cross section of a different one of the semiconductor pellets of the device of FIGURES 2 and 3;

FIGURE 6 is a single phase rectifier bridge circuit of the type which can be made in the integrated assembly form described herein; and FIGURES 7 and 8 are vertical sections through different housings which are useful for integrated rectifier circuit assemblies of the type illustrated in FIGURES 2 through 5 inclusive.

Figure 1:
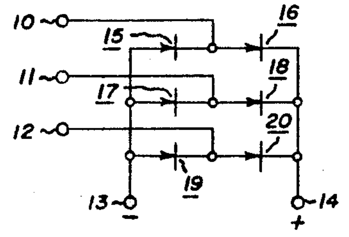
FIGURE 1 is a schematic circuit diagram showing a three phase bridge circuit as formed by the integrated rectifier circuit assembly of the device illustrated in FIGURES 2 through 5 inclusive.

FIGURE 1 illustrates diagrammatically an ordinary three phase bridge circuit which is provided as an integrated rectifier circuit assembly in the devices illustrated in FIGURES 2 through 5 inclusive. In FIGURE 1, three input terminals 10, 11 and 12 are provided for the application of a three phase alternating current source and two output terminals 13 and 14 (negative and positive terminals respectively) provided for the purpose of supplying direct current to a load (not shown).

The bridge circuit is made up of three pairs of rectifier diodes (15 and 16, 17 and 18, and 19 and 20, respectively). Each of the pairs of rectifier diodes are connected in series with each other and between the negative and positive direct current terminals 13 and 14 in such a manner as to pass conventional current in the direction from the negative terminal 13 through the diodes, through the alternating current source, and to positive terminal 14. Each of the alternating current terminals 10, 11 and 12 are electrically connected at a point between the two diodes of a respective pair. That is, alternating current terminal 10 is electrically connected between diodes 15 and 16, alternating current terminal 11 is connected between rectifier diodes 17 and 18 and alternating current terminal 12 is connected between rectifier diodes 19 and 20. Thus, a three phase rectifier bridge circuit is formed.

The integrated rectifier circuit assembly which provides the three phase AC bridge circuit described and illustrated in FIGURE 1 is shown in one embodiment of the invention in FIGURES 2 through 5 inclusive. The common elements of the assembly and the circuit of FIGURE 1 are given like reference numerals for purposes of clarity of description and reference. The supporting base for the assembly is a disc 22 of insulating material which forms a header for the ultimate enclosure for the device. In the preferred embodiment, the header 22 is of a material such as berylia (beryllium oxide) since it has very good thermal conductivity, excellent electrical insulating properties and a thermal coefficient of expansion which closely matches that of silicon pellets in a normal range of operating temperatures. As is best seen in FIGURE 2, the negative and positive device terminals 13 and 14 pass through header disc 22 and contact metallized areas 23 and 24 respectively on the header 22.

In order to provide the individual rectifier diodes of the three phases bridge (as illustrated in FIGURE 1) two separate generally rectangular semiconductor pellets 25 and 26 are provided. As illustrated, one semiconductor pellet 25 is formed of an N conductivity type semiconductor material. Separate individual rectifiers of the circuit of FIGURE 1 which have a like polarity (rectifiers 16, 18 and 20) are provided in the N conductivity type pellet 25 in an integrated form by providing P type regions 27, 28 and 29 respectively in one surface of the pellet 25 to form three separate PN junction rectifier units. N conductivity type pellet 25 is mounted to the metallized area 24 on the surface of the header which, in turn, is connected to the positive device electrode 14.

In order to provide the opposite bank of like poled diode rectifiers, that is, diode rectifiers which correspond to rectifiers 15, 17 and 19 of FIGURE 1, pellet 26 is formed of P type semiconductor material and has formed therein N type regions 30, 31 and 32 which, again, form PN junctions of the individual rectifiers of FIGURE 1. This pellet 26 is mounted with the P type material electrically connected directly to the metallized area 23 on the surface of header 22 which forms the negative electrode and which is electrically connected to the negative DC terminal 13 of the device.

Note that each of the individual pellets 25 and 26 is formed of semiconductor material of one conductivity type with opposite conductivity type regions diffused into one surface in isolated regions thereby to form the individual rectifier diodes. However, the isolated regions could be formed in any manner such as by diffusing in a uniform layer and then etching through to isolate the three upper regions in each pellet.

In order to provide the electrical connections between the individual rectifier pairs (15, 16; 17, 18; and 19 and 20) and, at the same time, form the alternating current terminals 10, 11 and 12 of the device, individual lead wires 33, 34 and 35 are brought up through apertures in header 22 and along side one of the individual pellets (here illustrated as pellet 25) and bent over both pellets in such a manner that a portion of the individual wires can be secured in suitable fashion (as by ultrasonic welding) to corresponding regions formed in the upper surface of the two pellets. For example, individual lead wire 33 contacts the P type region 27 of pellet 25 and N type region 30 of pellet 26 to form the series diode pair illustrated as rectifier diodes 15 and 16 in FIGURE 1. Correspondingly, lead wire 34 is connected to P type region 28 in pellet 25 and N type region 31 in pellet 26 to form rectifier diodes 17 and 18 and lead wire 35 is connected to P type region 28 of pellet 25 and N type region 32 of pellet 26 in order to form the rectifier diodes 19 and 20 respectively.

Thus, it is seen that utilizing only two semiconductor pellets 25 and 26, three alternating current terminals and two direct current terminals 13 and 14, an integrated three phase rectifier circuit assembly is provided.

FIGURE 6 illustrates how the invention can be applied to obtain a single phase integrated rectifier circuit assembly. Here reference numerals which correspond to components illustrated in FIGURE 1 are again used since only part of the assembly illustrated in the above figures is necessary to form the single phase rectifier bridge. That is, alternating current input terminals 10 and 11 of FIGURE 1 are the only input terminals necessary for single phase alternating current source and the two diode pairs 15 and 16 and 17 and 18 are the only two diodes necessary to produce a single phase rectification and give direct current output at output terminals 13 (negative) and 14 (positive). For the single phase bridge only two of the three regions which are formed in pellets 25 and 26 need be present.

FIGURE 7 illustrates the integrated rectifier circuit assembly included in a housing which can be mounted down to another heat sink. Again, the header and the rest of the assembly are given the same reference numerals as in FIGURES 2 through 5 inclusive and the header is shown sealed in a cup-shaped cap 36 which may be of a material such as copper or aluminum. The particular cup-shaped cap illustrated is provided with threads 37 around its outer periphery so that it may be screwed into a heat sink 40 as indicated. Obviously, other forms of mounting the assembly can be provided and where the pellet can be adequately passivated such as by using a planar passivation technique or by covering with a substance such as glass, the cap is not necessary to the structure.

In FIGURE 8, another structure embodying the invention is illustrated. Again, the parts which correspond to the device of FIGURES 2 through 5 inclusive are given like reference numerals. Note here, however, that neither the alternating current terminal leads nor the direct current terminal lead pass through the header 22. Here the leads extend directly upward from the semiconductor pellets and an epoxy or potting compound 38 surrounds the pellet and the leads and is sealed directly to the header 22 which, in turn, is sealed to a heat sink 39 by any means such as solder or heat conductive glue.

Thus, it is seen that the invention eliminates fabrication steps, components and also the connection steps normally required in the fabrication and ultilization of both single and three phase bridge circuits where individual diodes in individual packages are used. Further, heat sinking problems are reduced. Pellet fabrication for the integrated bridge lends itself to processing a wafer at a time whether it be for single or three phase bridges or for individual diodes. The approach also can be used for other rectifier configurations like center tapped and three phase half-wave circuits.

While particular embodiments of the invention have been described and illustrated, it will, of course, be understood that the invention is not limited to these particular embodiments since many modifications both in the circuit arrangements and in the instrumentalities employed may be made. It is contemplated that the appended claims will cover any such modifications as fall within the spirit and scope of the invention.

What I claim as new and desire to secure by Letters Patent of the United States is:

1. An integrated circuit assembly comprised of:
an electrically insulative substrate having a planar surface,
first and second spaced metallic conductive means supported by said planar surface of said substrate,
first and second spaced output electrodes extending through said substrate and intersecting said first and second metallic conductive means, respectively, at said planar surface of said substrate,
a pellet of N conductivity type supported by said first metallic conductive means,
said N type pellet having three P conductivity type regions spaced laterally thereon,
a pellet of P conductivity type supported by said second metallic conductive means,
said P type pellet having three N conductivity type regions spaced laterally thereon in correspondence with said P type regions,
three laterally spaced lead wires extending through said insulative substrate adjacent one of said pellets and separated from the remaining of said pellets by said one pellet,
one of said lead wires being positioned adjacent each of said three regions of said one pellet, and
each of said lead wires being bent over into engagement and electrical interconnection with said adjacent region of said adjacent pellet and said corresponding region of said separated pellet.

2. An integrated circuit assembly according to claim 1 additionally including thermally conductive cap means cooperating with the periphery of said substrate and electrically isolated from said electrodes and lead wires.

3. An integrated rectifier circuit assembly as defined in claim 1 wherein said semiconductor pellets are encapsulated to prevent exposure to the atmosphere.

4. An integrated circuit assembly comprised of:
an electrically insulative substrate having a planar surface,
first and second spaced metallic conductive means supported by said planar surface of said substrate,
first and second spaced output electrodes extending through said substrate and intersecting said first and second metallic conductive means, respectively, at said planar surface of said substrate,
a pellet of N conductivity type supported by said first metallic conductive means,
said N type pellet having a plurality of P conductivity type regions spaced laterally thereon,
a pellet of P conductivity type supported by said second metallic conductive means, said P type pellet having a plurality of N conductivity type regions spaced laterally thereon in correspondence with said P type regions, a plurality of laterally spaced lead wires extending through said insulative substrate adjacent each of said pellets and separated from the remaining of said pellets by said one pellet, one of said lead wires being positioned adjacent each of said spaced regions of said one pellet, and each of said lead wires being bent over into engagement and electrical interconnection with said adjacent region of said adjacent pellet and said corresponding region of said separated pellet.

5. An integrated circuit assembly comprised of:

an electrically insulative header having first and second planar surfaces, means for attaching said first planar surface to a heat sink, first and second spaced metallic conductive means supported by said second planar surface of said header, a pellet of N conductivity type supported by said first metallic conductive means, said N type pellet having a plurality of P conductivity type regions spaced laterally thereon, a pellet of P conductivity type supported by said second metallic conductive means, said P type pellet having a plurality of N conductivity type regions spaced laterally thereon in correspondence with said P type regions, lead wires each connecting one of said P type regions to one of said N type pellet to said corresponding N type region of said P type pellet, first and second output electrodes connected to said N type and P type pellets, respectively, and potting means sealingly cooperating with said electrodes, said lead wires, and said second planar surface of said header to encapsulate said pellets.

References Cited

UNITED STATES PATENTS

| | | | |
|---|---|---|---|
| 2,986,679 | 5/1961 | Storsand | 317—234 |
| 3,025,437 | 3/1962 | Van Namen et al. | 317—235 |
| 3,159,780 | 12/1964 | Parks | 321—46 |
| 3,190,952 | 6/1965 | Bitko | 174—52 |
| 3,292,050 | 12/1966 | Grossoehme | 317—100 |
| 3,340,427 | 9/1967 | Bisso | 315—155 |
| 3,356,914 | 12/1967 | Whigham et al. | 317—234 |

JAMES D. KALLAM, Primary Examiner

R. F. POLLISACK, Assistant Examiner

U.S. Cl. X.R.

317—235